(12) United States Patent
Na et al.

(10) Patent No.: US 11,452,213 B2
(45) Date of Patent: Sep. 20, 2022

(54) METHOD OF FABRICATING BATTERY PROTECTION CIRCUIT PACKAGE

(71) Applicant: ITM SEMICONDUCTOR CO., LTD., Chungcheongbuk-do (KR)

(72) Inventors: Hyuk Hwi Na, Chungcheongbuk-do (KR); Ho Seok Hwang, Gyeonggi-do (KR); Sang Hoon Ahn, Chungcheongbuk-do (KR); Hyun Seok Lee, Chungcheongbuk-do (KR)

(73) Assignee: ITM SEMICONDUCTOR CO., LTD, Chungcheongbuk-Do (KR)

( * ) Notice: Subject to any disclaimer, the term of this patent is extended or adjusted under 35 U.S.C. 154(b) by 0 days.

(21) Appl. No.: 17/183,500

(22) Filed: Feb. 24, 2021

(65) Prior Publication Data

US 2021/0368631 A1    Nov. 25, 2021

(30) Foreign Application Priority Data

May 12, 2020    (KR) .......................... 10-2020-0056510

(51) Int. Cl.
  *H05K 3/28*    (2006.01)
  *H05K 1/14*    (2006.01)
  *H05K 3/00*    (2006.01)
  *H05K 3/32*    (2006.01)
  (Continued)

(52) U.S. Cl.
  CPC .............. *H05K 3/284* (2013.01); *H05K 1/14* (2013.01); *H05K 3/0061* (2013.01); *H05K 3/32* (2013.01); *H02H 7/18* (2013.01); *H05K 1/181* (2013.01); *H05K 2201/1028* (2013.01); *H05K 2201/10166* (2013.01); *H05K 2201/10189* (2013.01); *H05K 2203/1327* (2013.01)

(58) Field of Classification Search
  CPC ........ H05K 3/284; H05K 3/0061; H05K 3/32; H05K 2203/1327; H05K 1/14; H05K 1/181; H05K 2201/10166; H05K 2201/10189; H05K 2201/1028; H01M 10/425; H01L 23/28; H01L 23/495; H01L 24/45; Y10T 29/49146; Y10T 29/49149
  USPC .......................................... 29/832, 840–843
  See application file for complete search history.

(56) References Cited

U.S. PATENT DOCUMENTS 7,297,439 B2 * 11/2007 Yamazaki ........... H01M 10/425
                                                          429/178
8,098,045 B2 *  1/2012 Okano ................... H05K 3/305
                                                          429/100
2017/0018816 A1 *  1/2017 Na ..................... H01M 10/4257

FOREIGN PATENT DOCUMENTS

KR    1020090117315    11/2009
KR    20150119774      10/2015
(Continued)

*Primary Examiner* — Donghai D Nguyen
(74) *Attorney, Agent, or Firm* — Mayer & Williams, PC; Stuart H. Mayer

(57) ABSTRACT

Provided is a method of fabricating a battery protection circuit package, the method including preparing a complex package substrate obtained by connecting a flexible printed circuit board (PCB) including at least one external connection terminal for connection to an external device, to a rigid PCB for mounting components thereon, mounting the complex package substrate on a lead frame including at least one metal tab for connection to a battery cell, and encapsulating at least portions of the complex package substrate and the lead frame with a molded part while exposing the at least one metal tab and the at least one external connection terminal.

9 Claims, 8 Drawing Sheets

(51) Int. Cl.
*H02H 7/18* (2006.01)
*H05K 1/18* (2006.01)

(56) References Cited

FOREIGN PATENT DOCUMENTS

| | | |
|---|---|---|
| KR | 20180050880 | 5/2018 |
| KR | 102017674 | 9/2019 |

* cited by examiner

METHOD OF FABRICATING BATTERY PROTECTION CIRCUIT PACKAGE

CROSS-REFERENCE TO RELATED PATENT APPLICATION

This application claims the benefit of Korean Patent Application No. 10-2020-0056510, filed on May 12, 2020, in the Korean Intellectual Property Office, the disclosure of which is incorporated herein in its entirety by reference.

BACKGROUND

1. Field

The present invention relates to a battery and, more particularly, to a battery protection circuit package and a method of fabricating the same.

2. Description of the Related Art

Batteries are generally used in electronic devices such as mobile phones and personal digital assistants (PDAs). As batteries most commonly used in mobile devices and the like, lithium ion batteries are heated when overcharge or overcurrent occurs, and experience performance degradation and even have the risk of explosion when heating is continued to increase the temperature thereof. Accordingly, batteries are increasingly required to include a battery protection circuit device for interrupting battery operation to prevent the above-described performance degradation.

Therefore, general batteries include a protection circuit module for detecting and blocking overcharge, overdischarge, and overcurrent, or use an external protection circuit for detecting overcharge, overdischarge, or heating and interrupting battery operation. Reducing sizes and ensuring stability of battery packs are currently emerging as critical technical issues.

PRIOR ART DOCUMENT

Patent Document (Patent Document 1) 1. Korean Patent Application Publication No. 10-2009-0117315 (published on Nov. 12, 2009, and title of invention: Battery Pack)

SUMMARY

Currently, because flexible substrates as well as rigid substrates are used in battery protection circuit packages, a package structure is complicated, the number of fabricating processes is increased, and thus thermal stability of solder is reduced.

The present invention provides a flexible-substrate-connected battery protection circuit package capable of simplifying fabricating processes to achieve high thermal stability, and a method of fabricating the same. However, the scope of the present invention is not limited thereto.

According to an aspect of the present invention, there is provided a method of fabricating a battery protection circuit package, the method including preparing a complex package substrate obtained by connecting a flexible printed circuit board (PCB) including at least one external connection terminal for connection to an external device, to a rigid PCB for mounting components thereon, mounting the complex package substrate on a lead frame including at least one metal tab for connection to a battery cell, and encapsulating at least portions of the complex package substrate and the lead frame with a molded part while exposing the at least one metal tab and the at least one external connection terminal.

The preparing of the complex package substrate may include preparing the complex package substrate obtained by bonding the flexible PCB to an end of the rigid PCB in a sandwich structure, and the encapsulating may include encapsulating the rigid PCB with the molded part while exposing the flexible PCB.

The mounting of the complex package substrate on the lead frame may include bonding the rigid PCB to the lead frame while the flexible PCB is not in contact with the lead frame.

The method may further include attaching battery protection circuit devices onto the rigid PCB of the complex package substrate after the complex package substrate is mounted on the lead frame, and the encapsulating may include encapsulating the battery protection circuit devices with the molded part.

The method may further include mounting components including at least one passive device, on the rigid PCB of the complex package substrate before the complex package substrate is mounted on the lead frame.

The mounting of the components may include mounting the components on a plurality of the complex package substrates arranged on a strip, and the method may further include separating the plurality of complex package substrates from the strip after the components are mounted.

The method may further include performing wire bonding to connect the battery protection circuit devices to the rigid PCB, after the battery protection circuit devices are attached.

The method may further include performing an underfill process on bonded portions of at least some of the battery protection circuit devices mounted on the rigid PCB, by using epoxy before the encapsulating.

The lead frame and the at least one metal tab may be provided as one body, and include copper (Cu) or nickel (Ni).

The at least one metal tab of the lead frame may include a pair of metal tabs spaced apart from each other in a lengthwise direction, and the mounting of the complex package substrate on the lead frame may include mounting the complex package substrate on a portion of the lead frame to place one of the pair of metal tabs outside the complex package substrate.

BRIEF DESCRIPTION OF THE DRAWINGS

The above and other features and advantages of the present invention will become more apparent by describing in detail embodiments thereof with reference to the attached drawings in which.

DETAILED DESCRIPTION

Figure 1:
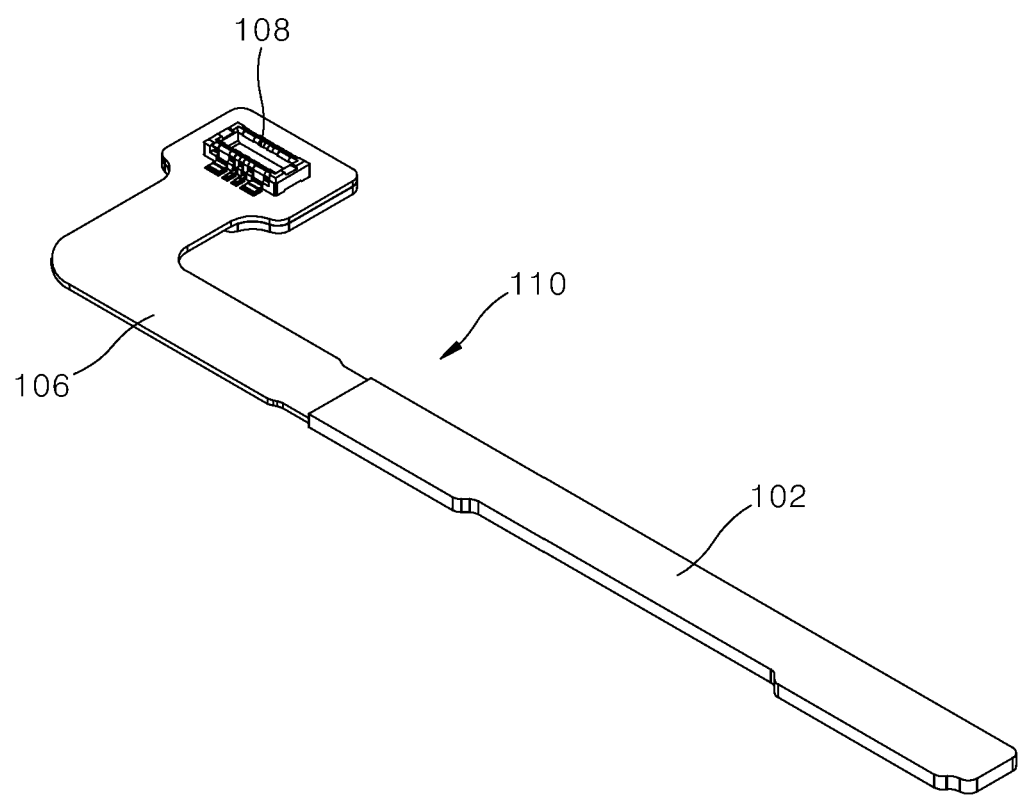
FIGS. 1 to 8 are schematic views for describing a battery protection circuit package and a method of fabricating the same, according to an embodiment of the present invention.

Hereinafter, the present invention will be described in detail by explaining embodiments of the invention with reference to the attached drawings.

The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses or sizes of layers are exaggerated for clarity or convenience of explanation.

It will be understood that when an element, such as a layer, a region, or a substrate, is referred to as being "on", "connected to", "stacked on", or "coupled to" another element, it may be directly on, connected to, stacked on, or coupled to the other element or intervening elements may be present. In contrast, when an element is referred to as being "directly on", "directly connected to", "directly stacked on", or "directly coupled to" another element or layer, there are no intervening elements or layers present. Like reference numerals denote like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the invention. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing.

FIGS. 1 to 8 are schematic views for describing a battery protection circuit package 100 and a method of fabricating the same, according to an embodiment of the present invention. FIG. 9 is a cross-sectional view of the battery protection circuit package 100 according to an embodiment of the present invention.

Referring to FIG. 1, a complex package substrate 110 obtained by connecting a flexible printed circuit board (PCB) 106 including at least one external connection terminal 108 for connection to an external device, to a rigid PCB 102 for mounting components thereon may be prepared.

For example, the rigid PCB 102 may include a rigid core structure having a circuit pattern thereon. Furthermore, the rigid PCB 102 may include via electrodes to electrically connect components from an upper side to a lower side thereof. The rigid PCB 102 may further include a wiring or pad pattern for rewiring the via electrodes.

The flexible PCB 106 may include a flexible core structure having a circuit pattern thereon. The circuit pattern may be electrically connected to the external connection terminal 108 for connection to an external device. For example, the external connection terminal 108 may include a connector structure or a pad pattern.

For example, in the complex package substrate 110, the flexible PCB 106 may be bonded to an end of the rigid PCB 102 in a sandwich structure. The end of the rigid PCB 102 may be divided into at least two layers to allow the flexible PCB 106 to be inserted therebetween, and the flexible PCB 106 may be inserted and bonded into a space between the layers. Circuit wires of the flexible PCB 106 and the rigid PCB 102 may be connected to each other in the sandwich structure.

Figure 2:
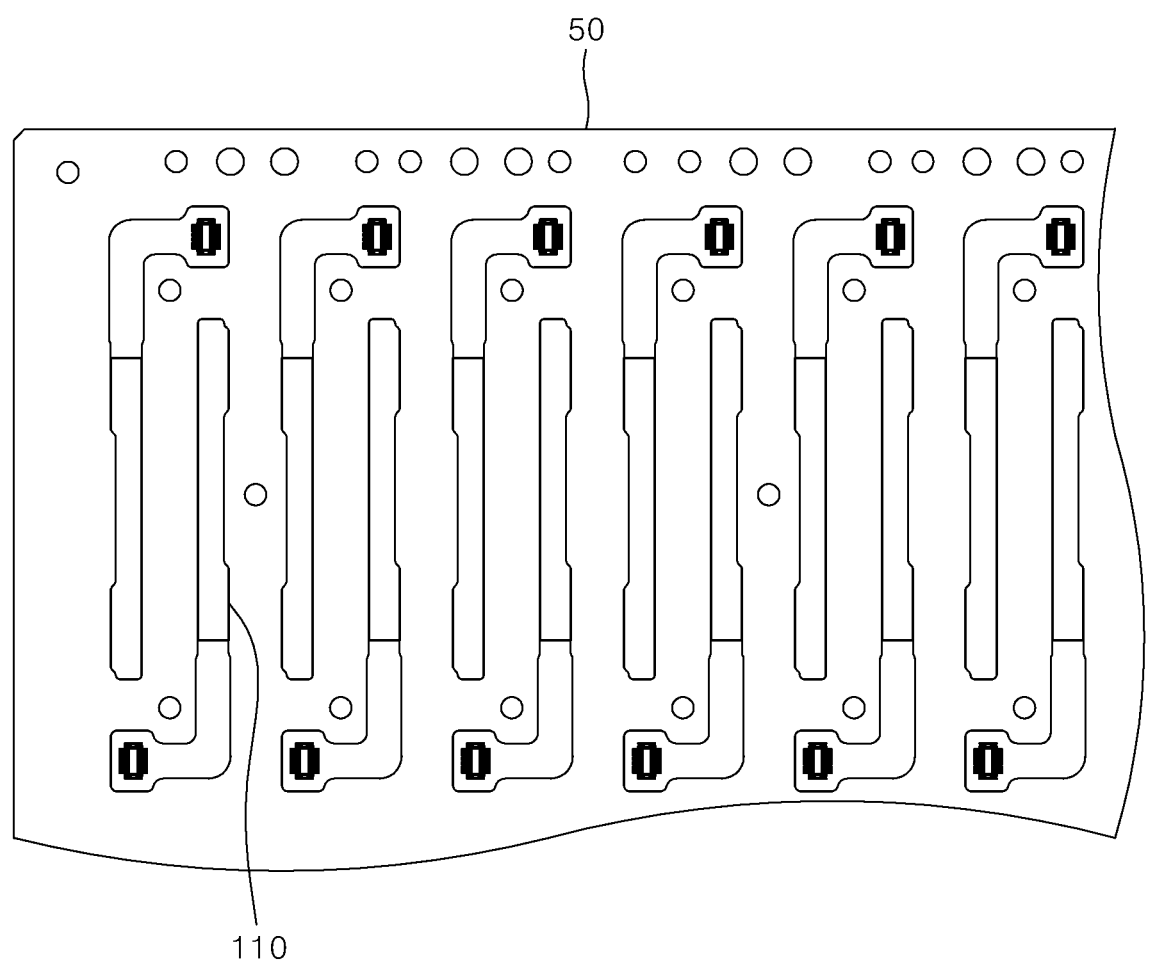

In an embodiment, as illustrated in FIG. 2, a plurality of such complex package substrates 110 may be arranged on a strip 50. In this case, the plurality of complex package substrates 110 may be arranged or transported by using the strip 50, and thus productivity may be increased.

Figure 3:
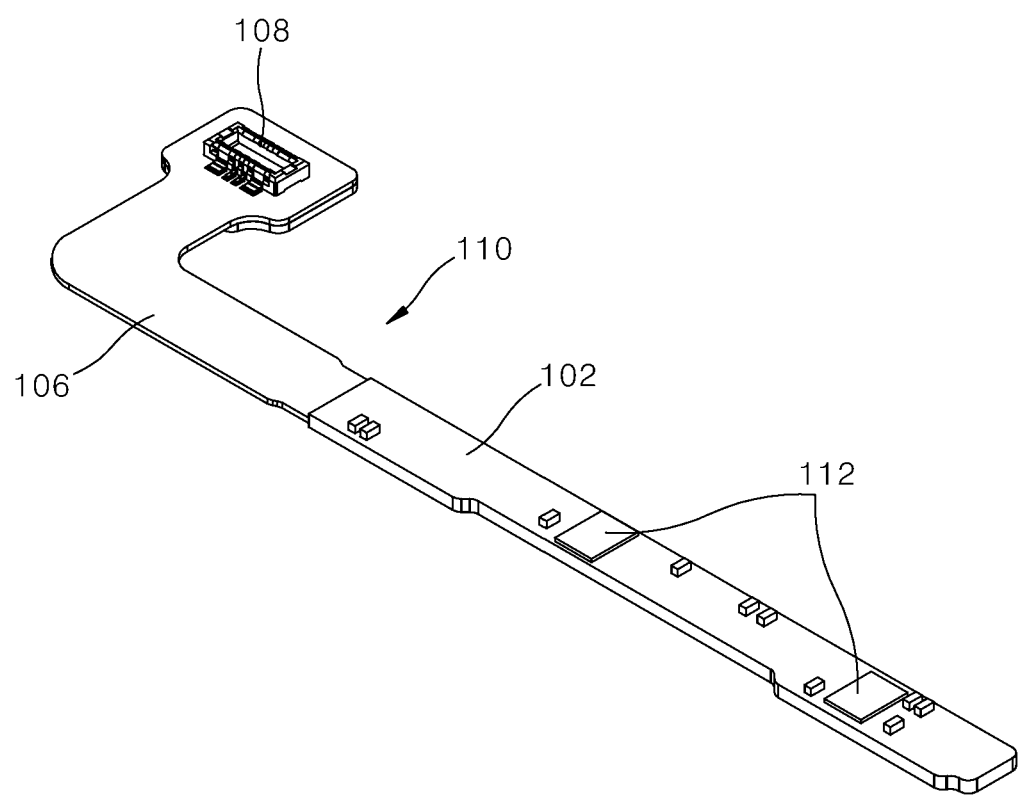

Referring to FIG. 3, components 112 including at least one passive device may be mounted on the rigid PCB 102 of the complex package substrate 110. For example, the components 112 may include at least one passive device from among capacitors, resistors, and inductors of a battery protection circuit.

For example, the components 112 may be bonded onto the complex package substrate 110 by using surface mount technology (SMT). SMT may refer to a technology for attaching components onto the surface of the complex package substrate 110. For example, the components 112 may be attached to the circuit pattern on the surface of the complex package substrate 110 by using soldering technology.

In some embodiments, the components 112 may be attached in batch units to the plurality of complex package substrates 110 arranged on the strip 50.

Then, optionally, the plurality of complex package substrates 110 may be separated from the strip 50.

Figure 4:
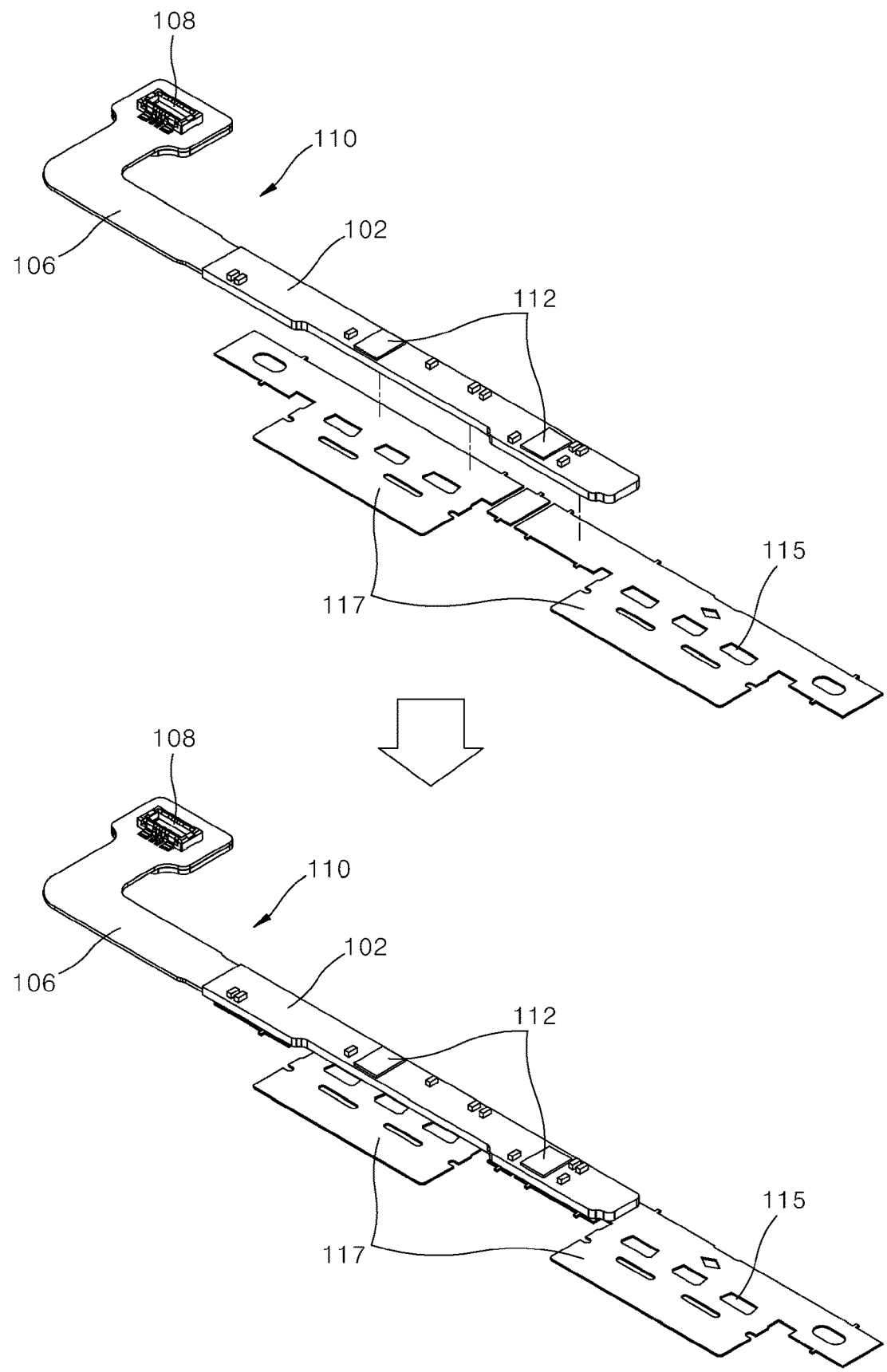

Referring to FIG. 4, the complex package substrate 110 may be mounted on a lead frame 115 including at least one metal tab 117 for connection to a battery cell.

For example, the complex package substrate 110 may be attached onto the surface of the lead frame 115 by using soldering technology. Specifically, the complex package substrate 110 may be bonded onto the lead frame 115 by using SMT.

Then, optionally, a deflux process may be additionally performed to remove solder flux.

For example, the metal tab 117 for connection to the battery cell may protrude from a side of the lead frame 115. Furthermore, the lead frame 115 and the metal tab 117 may be provided as one body. For example, the lead frame 115 and the metal tab 117 may be made of the same metal material, e.g., copper (Cu) or nickel (Ni). The metal tab 117 may be used to connect the lead frame 115 to the battery cell, and be electrically connected to the battery cell by using a method such as soldering or laser welding.

In some embodiments, the lead frame 115 may include a pair of metal tabs 117 spaced apart from each other in a lengthwise direction. In the step of mounting the complex package substrate 110 on the lead frame 115, the complex package substrate 110 may be mounted on a portion of the lead frame 115 to place one of the pair of metal tabs 117 outside the complex package substrate 110.

For example, the lead frame 115 may have a length greater than the length of the rigid PCB 102, the rigid PCB 102 of the complex package substrate 110 may be mounted on about a half of the lead frame 115, and the other half of the lead frame 115 may protrude from an end of the rigid PCB 102 in a lengthwise direction.

In this mounting step, the rigid PCB 102 may be bonded onto a portion of the lead frame 115 while the flexible PCB 106 is not in contact with the lead frame 115.

In some embodiments, the process of mounting the complex package substrate 110 on the lead frame 115 may be performed after the separated complex package substrates 110 are mounted on a tray or tape.

Figure 5:
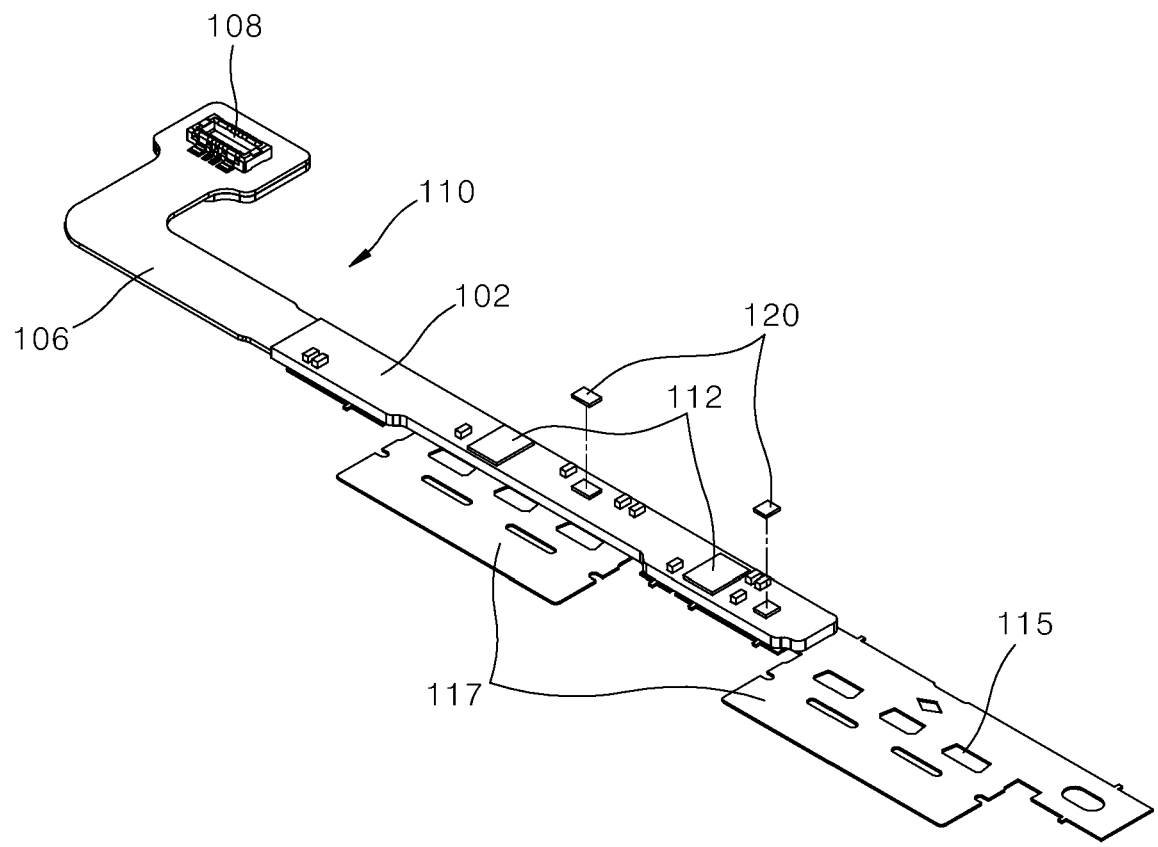

Referring to FIG. 5, after the complex package substrate 110 is mounted on the lead frame 115, battery protection circuit devices 120 may be attached onto the rigid PCB 102 of the complex package substrate 110.

The battery protection circuit devices 120 may include devices for protecting a battery during battery operations, e.g., charge and discharge operations. For example, the battery protection circuit devices 120 may include at least one transistor, e.g., a field effect transistor (FET), and a protection integrated circuit (IC).

The protection IC may monitor a voltage and control an on/off operation of the FET to control the charge or discharge operation. For example, the protection IC may turn off the FET when overcurrent or overdischarge is detected in the battery discharge operation or when overcurrent or overcharge is detected in the battery charge operation.

For example, the battery protection circuit devices 120 may be mounted on the rigid PCB 102 by using SMT. The battery protection circuit devices 120 may be attached to the circuit pattern on the surface of the rigid PCB 102 by using soldering technology.

In the current embodiment, the battery protection circuit devices 120 may be mounted on the rigid PCB 102 in an unpackaged wafer or die level. Therefore, because the battery protection circuit devices 120 do not need to be pre-packaged, fabricating processes may be simplified and a small thickness may be achieved.

In an embodiment modified from the current embodiment, both of the battery protection circuit devices 120 and the components 112 including the passive device may be mounted before or after the lead frame 115 is attached to the complex package substrate 110.

Figure 6:
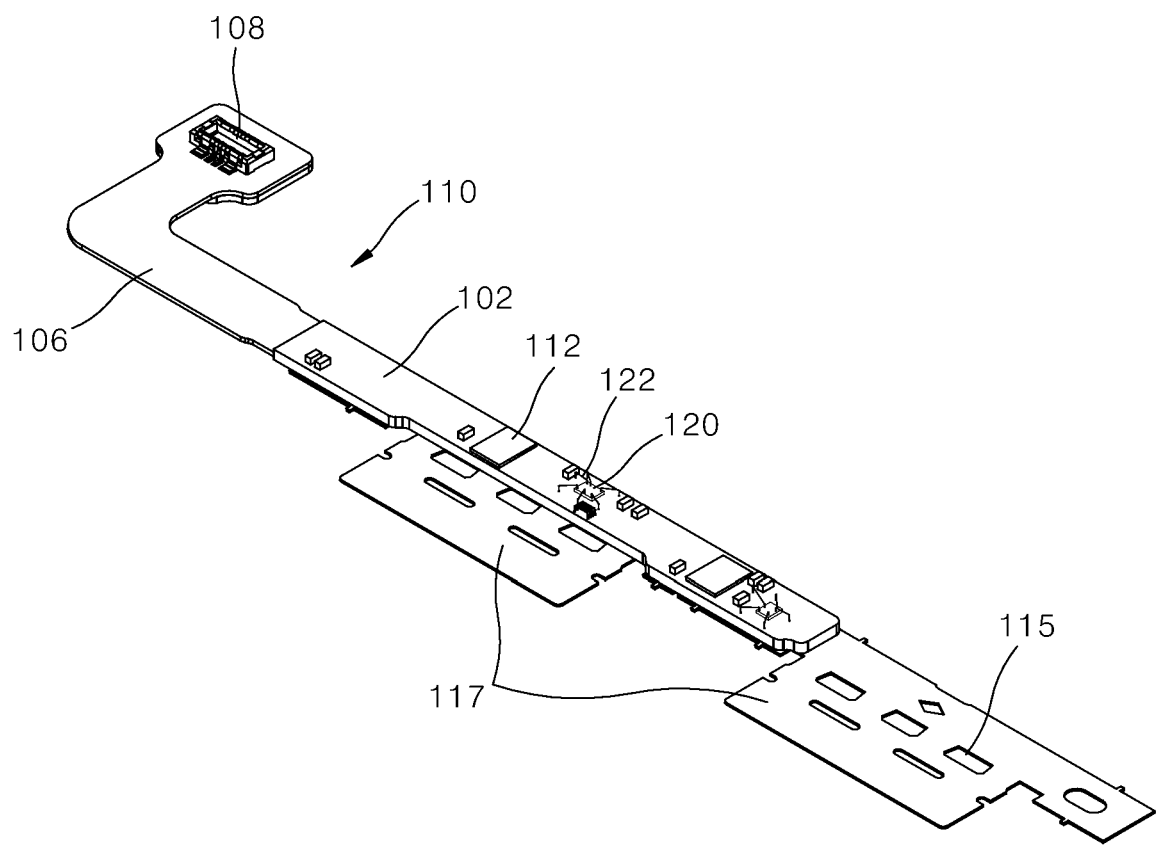

Referring to FIG. 6, the battery protection circuit devices 120 may be electrically connected to the rigid PCB 102 by using bonding wires 122.

In an embodiment modified from the current embodiment, the battery protection circuit devices 120 may be stacked and connected onto the rigid PCB 102 by using, for example, solder balls instead of the bonding wires 122.

Optionally, an underfill process may be performed on bonded portions of at least some of the battery protection circuit devices 120 mounted on the rigid PCB 102.

For example, the underfill process may be performed by filling epoxy between the battery protection circuit devices 120 and the rigid PCB 102 to cover solder balls for bonding the battery protection circuit devices 120 to the rigid PCB 102. For example, the underfill process may be performed by using epoxy to cover solder balls of the FET and the protection IC from among the battery protection circuit devices 120.

Due to the underfill process, bonding reliability between the battery protection circuit devices 120 and the rigid PCB 102 may be increased and defects such as cracks may be prevented.

Figure 7:
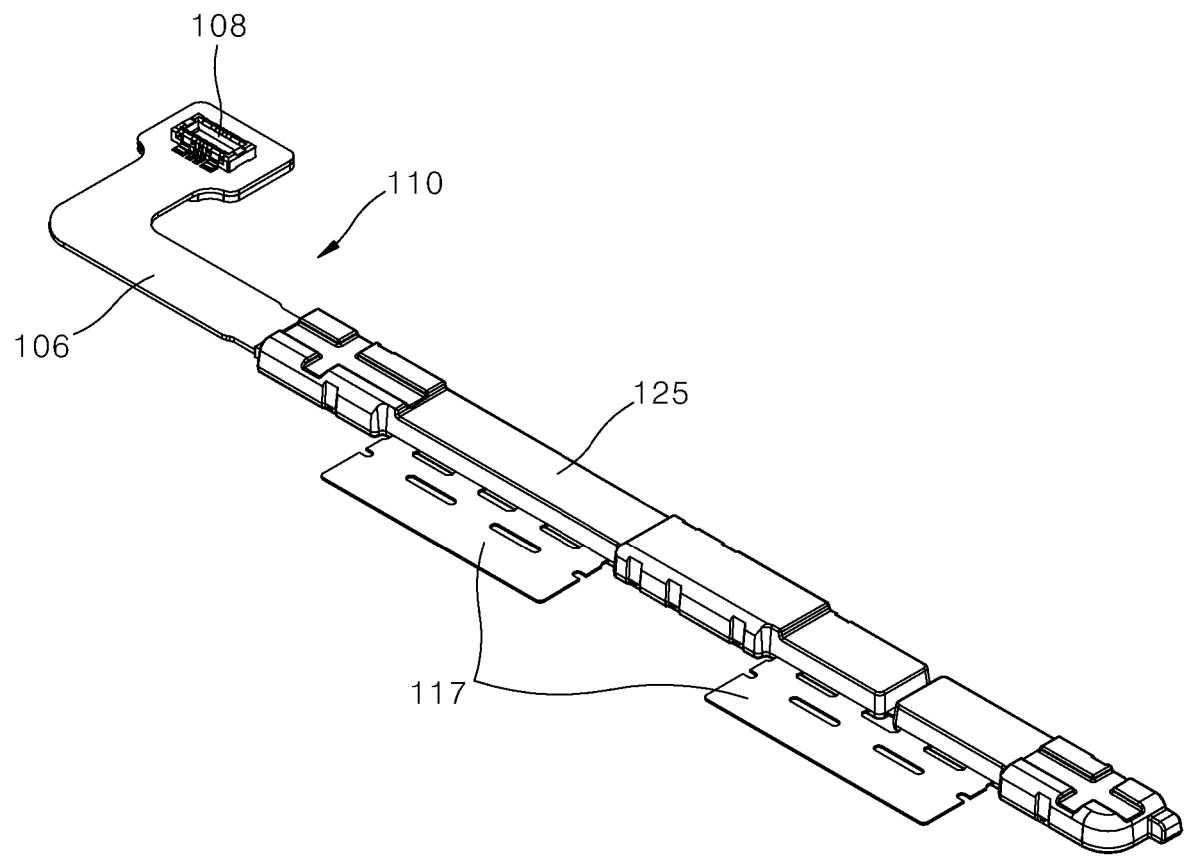

Referring to FIG. 7, at least portions of the complex package substrate 110 and the lead frame 115 may be encapsulated with a molded part 125 while exposing the at least one metal tab 117 and the at least one external connection terminal 108.

For example, the molded part 125 may form an encapsulation structure to encapsulate at least some of the battery protection circuit devices 120 while exposing the metal tab 117 and the external connection terminal 108 of the complex package substrate 110.

Specifically, in this encapsulation step, the molded part 125 may encapsulate the rigid PCB 102 while exposing the flexible PCB 106. Furthermore, the molded part 125 may cover the battery protection circuit devices 120 and further cover the rigid PCB 102 and side and bottom surfaces of the lead frame 115.

For example, the molded part 125 may be formed by using a method such as transfer molding or insert molding and be made of an epoxy molding compound (EMC).

Then, optionally, a deflashing process may be additionally performed on the molded structure. The deflashing process may be a resin component removal process for removing the EMC spilled out in the molding process. For example, the deflashing process may use an abrasive method, a chemical method, an electrolytic method, a laser method, a waterjet method, or the like.

Figure 8:
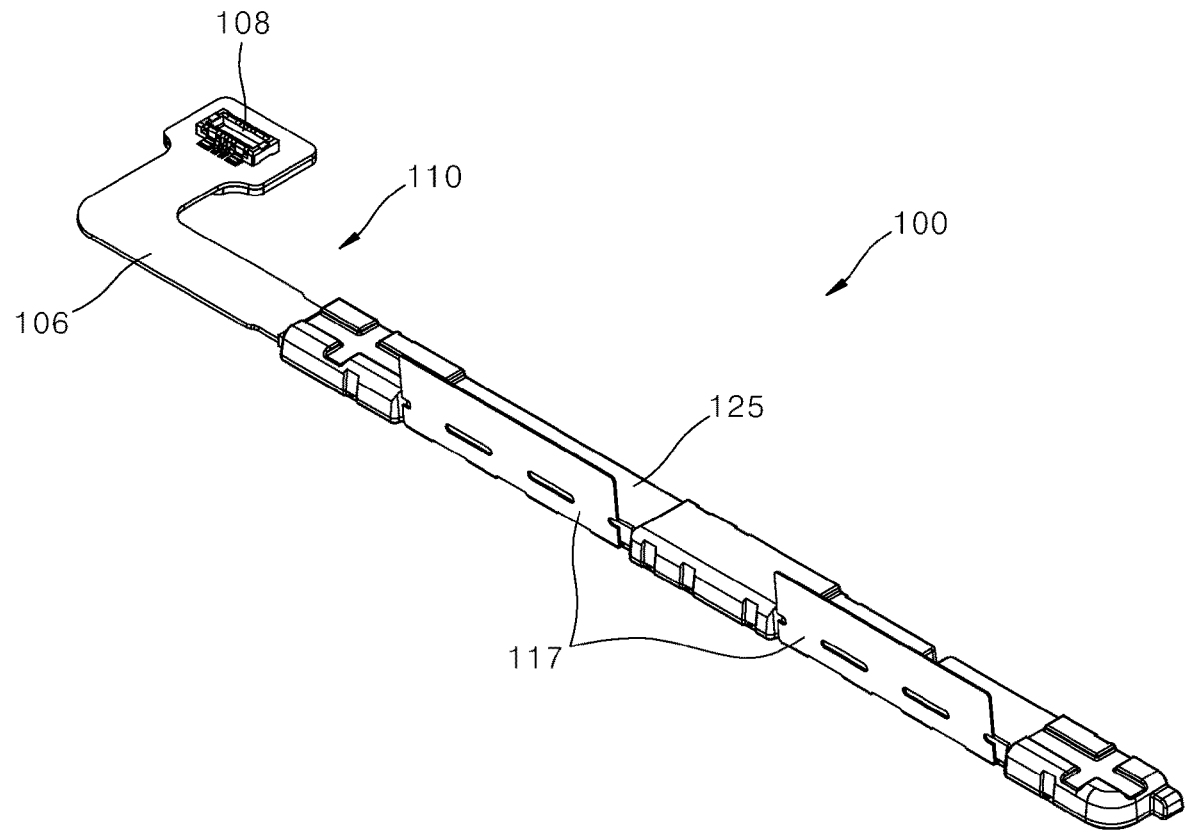
Figure 9:
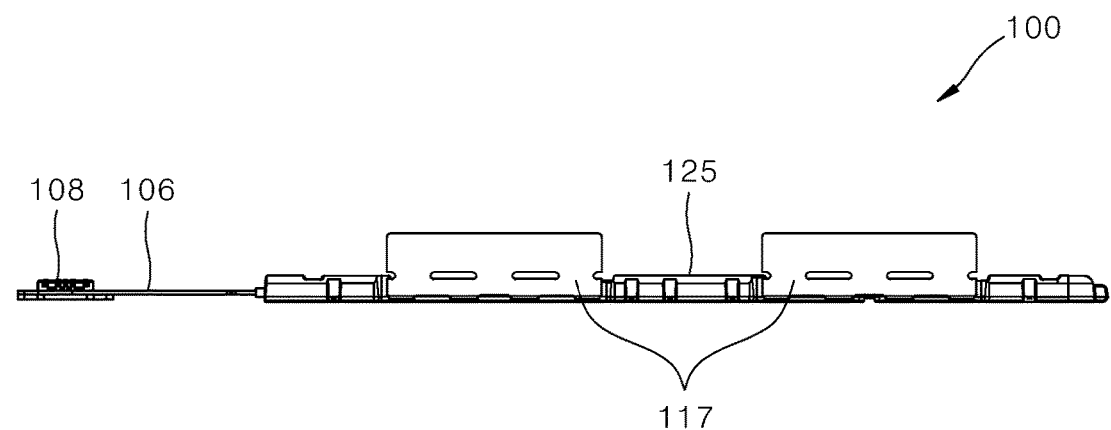
FIG. 9 is a cross-sectional view of a battery protection circuit package according to an embodiment of the present invention.

Referring to FIGS. 8 and 9, the complex package substrate 110 may be trimmed and/or formed to produce the battery protection circuit package 100.

For example, the metal tabs 117 may be bent to be easily connected to the battery cell.

Then, optionally, the battery protection circuit package 100 may be tested for an inspection.

According to the above description, the battery protection circuit package 100 may include the complex package substrate 110 obtained by connecting the flexible PCB 106 including at least one external connection terminal 108 for connection to an external device, to the rigid PCB 102 for mounting components thereon, the lead frame 115 including at least one metal tab 117 for connection to a battery cell, and used to mount the complex package substrate 110 thereon, the components 112 and the battery protection circuit devices 120 mounted on the rigid PCB 102, and the molded part 125 for encapsulating at least some of the battery protection circuit devices 120.

In general, because a molding process is performed on the rigid PCB 102 and then the flexible PCB 106 is attached to the molded structure, a terminal plating process is added after the molding process, and a process for coupling the flexible PCB 106 after a subsequent forming process and a process for testing the final structure are added. However, in the afore-described embodiment of the present invention, because the complex package substrate 110 obtained by coupling the rigid PCB 102 to the flexible PCB 106 is used in an initial stage, a terminal plating process and a reflow process are not required after a molding process, and an assembly process for coupling the rigid PCB 102 to the flexible PCB 106 and a test process after assembly may be omitted.

Therefore, according to embodiments of the present invention, a thermal margin may be increased by omitting a terminal plating process and a subsequent reflow process, and processes may be simplified by omitting the terminal plating process, an assembly process, and a subsequent test process, thereby increasing process stability/reliability and ensuring economic feasibility.

According to the afore-described embodiments of the present invention, a battery protection circuit package capable of simplifying fabricating processes and achieving high thermal stability, and a method of fabricating the same may be provided. However, the scope of the present invention is not limited to the above-described effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of fabricating a battery protection circuit package, the method comprising:
    preparing a complex package substrate obtained by connecting a flexible printed circuit board (PCB) comprising at least one external connection terminal for connection to an external device, to a rigid PCB for mounting components thereon;
    mounting the complex package substrate on a lead frame comprising at least one metal tab for connection to a battery cell;
    encapsulating at least portions of the complex package substrate and the lead frame with a molded part while exposing the at least one metal tab and the at least one external connection terminal;
    further comprising attaching battery protection circuit devices onto the rigid PCB of the complex package substrate after the complex package substrate is mounted on the lead frame, and
    wherein the encapsulating comprises encapsulating the battery protection circuit devices with the molded part.

2. The method of claim 1, wherein the preparing of the complex package substrate comprises preparing the complex package substrate obtained by bonding the flexible PCB to an end of the rigid PCB in a sandwich structure, and
    wherein the encapsulating comprises encapsulating the rigid PCB with the molded part while exposing the flexible PCB.

3. The method of claim 1, wherein the mounting of the complex package substrate on the lead frame comprises bonding the rigid PCB to the lead frame while the flexible PCB is not in contact with the lead frame.

4. The method of claim 1, further comprising mounting components comprising at least one passive device, on the rigid PCB of the complex package substrate before the complex package substrate is mounted on the lead frame.

5. The method of claim 4, wherein the mounting of the components comprises mounting the components on a plurality of the complex package substrates arranged on a strip, and
    wherein the method further comprises separating the plurality of complex package substrates from the strip after the components are mounted.

6. The method of claim 1, further comprising performing wire bonding to connect the battery protection circuit devices to the rigid PCB, after the battery protection circuit devices are attached.

7. The method of claim 6, further comprising performing an underfill process on bonded portions of at least some of the battery protection circuit devices mounted on the rigid PCB, by using epoxy before the encapsulating.

8. The method of claim 1, wherein the lead frame and the at least one metal tab are provided as one body, and comprise copper (Cu) or nickel (Ni).

9. The method of claim 1, wherein the at least one metal tab of the lead frame comprises a pair of metal tabs spaced apart from each other in a lengthwise direction, and
    wherein the mounting of the complex package substrate on the lead frame comprises mounting the complex package substrate on a portion of the lead frame to place one of the pair of metal tabs outside the complex package substrate.

* * * * *